US012581982B2

(12) United States Patent
Eto et al.

(10) Patent No.: US 12,581,982 B2
(45) Date of Patent: Mar. 17, 2026

(54) BONDING WIRE FOR SEMICONDUCTOR DEVICES

(71) Applicants: NIPPON MICROMETAL CORPORATION, Saitama (JP); NIPPON STEEL Chemical & Material Co., Ltd., Tokyo (JP)

(72) Inventors: Motoki Eto, Saitama (JP); Daizo Oda, Saitama (JP); Tomohiro Uno, Tokyo (JP); Tetsuya Oyamada, Tokyo (JP)

(73) Assignees: NIPPON MICROMETAL CORPORATION, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 657 days.

(21) Appl. No.: 17/913,365

(22) PCT Filed: Mar. 18, 2021

(86) PCT No.: PCT/JP2021/011217
§ 371 (c)(1),
(2) Date: Sep. 21, 2022

(87) PCT Pub. No.: WO2021/193378
PCT Pub. Date: Sep. 30, 2021

(65) Prior Publication Data
US 2023/0148306 A1     May 11, 2023

(30) Foreign Application Priority Data
Mar. 25, 2020     (JP) ................................. 2020-055028

(51) Int. Cl.
*H01L 23/00*          (2006.01)

(52) U.S. Cl.
CPC .............. *H01L 24/45* (2013.01); *H01L 24/85* (2013.01); *H01L 24/48* (2013.01); *H01L 2224/45109* (2013.01); *H01L 2224/45118* (2013.01); *H01L 2224/45123* (2013.01); *H01L 2224/45139* (2013.01); *H01L 2224/45147* (2013.01); *H01L 2224/45155* (2013.01); *H01L 2224/4516* (2013.01); *H01L 2224/45166* (2013.01); *H01L 2224/45169* (2013.01); *H01L 2224/45173* (2013.01); *H01L 2224/45178* (2013.01); *H01L 2224/45565* (2013.01); *H01L 2224/45609* (2013.01); *H01L 2224/45618* (2013.01); *H01L 2224/45623* (2013.01); *H01L 2224/45639* (2013.01); *H01L 2224/45644* (2013.01); *H01L 2224/45655* (2013.01); *H01L 2224/4566* (2013.01); *H01L 2224/45664* (2013.01); *H01L 2224/45666* (2013.01); *H01L 2224/45669* (2013.01); *H01L 2224/45673* (2013.01); *H01L 2224/45678* (2013.01); *H01L 2224/48472* (2013.01); *H01L 2224/85099* (2013.01); *H01L 2924/3512* (2013.01); *H01L 2924/365* (2013.01)

(58) Field of Classification Search
CPC ............................................ H01L 2224/45147
See application file for complete search history.

(56) References Cited

U.S. PATENT DOCUMENTS

| | | | |
|---|---|---|---|
| 2009/0188696 A1 | 7/2009 | Uno et al. | |
| 2012/0104613 A1 | 5/2012 | Uno et al. | |
| 2012/0118610 A1* | 5/2012 | Terashima | ................ C22C 5/06 |
| | | | 174/126.2 |
| 2015/0303165 A1 | 10/2015 | Milke et al. | |
| 2019/0164927 A1 | 5/2019 | Yamada et al. | |
| 2020/0373226 A1 | 11/2020 | Oda et al. | |
| 2021/0280553 A1 | 9/2021 | Amano et al. | |

FOREIGN PATENT DOCUMENTS

| | | |
|---|---|---|
| JP | 2004-311644 A | 11/2004 |
| JP | 2007-12776 A | 1/2007 |
| JP | 2010-212697 A | 9/2010 |
| JP | 2011-249463 A | 12/2011 |
| JP | 2016-511529 A | 4/2016 |
| JP | 2019-33275 A | 2/2019 |
| JP | 6487108 B1 | 3/2019 |
| KR | 20130122325 A | 11/2013 |
| KR | 2019-0120420 A | 10/2019 |
| TW | 201642279 A | 12/2016 |
| TW | 201936934 A | 9/2019 |
| WO | 2014/137287 A1 | 9/2014 |
| WO | 2019/130570 A1 | 7/2019 |

OTHER PUBLICATIONS

Partial Supplementary European Search Report issued in the corresponding European Application No. 21776531.2 dated Feb. 21, 2024 (15 pages).
Dohle et al., "Room temperature wedge-wedge ultrasonic bonding using aluminum coated copper wire", Microelectronics Reliability 51 (2011) pp. 97-106 (10 pages).
International Search Report issued in corresponding International Patent Application No. PCT/JP2021/011217, filed Jun. 22, 2021, with English translation.
Search Report and Written Opinion dated Mar. 5, 2025, issued in corresponding Singapore Patent Application No. 11202253164E, 11 pages.
Office Action dated Sep. 27, 2024, from corresponding Taiwanese Patent Application No. 110110358, 23 pages.

(Continued)

*Primary Examiner* — Yu-Hsi D Sun
(74) *Attorney, Agent, or Firm* — Rimon P.C.

(57) ABSTRACT

There is provided a bonding wire for semiconductor devices that exhibits a favorable bondability even when being applied to wedge bonding at the room temperature, and also achieves an excellent bond reliability. The bonding wire includes a core material of Cu or Cu alloy (hereinafter referred to as a "Cu core material"), and a coating containing a noble metal formed on a surface of the Cu core material. A concentration of Cu at a surface of the wire is 30 to 80 at %.

13 Claims, No Drawings

(56)        References Cited

OTHER PUBLICATIONS

Extended European Search Report dated Jul. 9, 2024, from corre-
sponding EP Application No. 21776531.2, 26 pages.
Office Action dated Sep. 17, 2025, issued in corresponding Korean
Patent Application No. 10-2022-7031913, 13 pages.

* cited by examiner

BONDING WIRE FOR SEMICONDUCTOR DEVICES

CROSS-REFERENCE OF RELATED APPLICATIONS

This application is the U.S. National Phase under 35 U.S.C. § 371 of International Patent Application No. PCT/JP2021/011217, filed on Mar. 18, 2021, which in turn claims the benefit of Japanese Patent Application No. 2020-055028, filed on Mar. 25, 2020, the entire disclosures of which Applications are incorporated by reference herein.

TECHNICAL FIELD

The present invention relates to a bonding wire for semiconductor devices. The present invention further relates to a method for manufacturing a semiconductor device using the bonding wire, and a semiconductor device including the bonding wire.

BACKGROUND ART

In semiconductor devices, electrodes formed on a semiconductor element are connected with electrodes on a lead frame or a substrate using a bonding wire. As a bonding wire for wedge bonding having a diameter smaller than 100 μm, there is mainly used a bonding wire primarily composed of aluminum (Al) that can be bonded at the room temperature ($25\pm10°$ C.) (hereinafter also simply referred to as an "Al wire") (for example, Patent Literature 1).

On the other hand, regarding a packaging (sealing) technique for semiconductor devices, a hermetic sealing with metal, glass, and/or ceramics has been conventionally employed, but a resin sealing using a thermosetting epoxy resin has been increasingly used in view of cost and mass productivity.

RELATED ART REFERENCE

Patent Literature

Patent Literature 1: JP-T-2016-511529

SUMMARY OF INVENTION

Problem to be Solved by the Invention

Due to the change in the sealing technique for semiconductor devices, the bonding wire tends to be subjected to an environment including ionic impurities and moisture unlike the conventional hermetic sealing. In such an environment, a corrosion of the Al wire remarkably proceeds, and a bond reliability is difficult to maintain. Furthermore, the Al wire is easily recrystallized and has a large coefficient of thermal expansion due to its physical property, so that the Al wire is difficult to be applied to a high-temperature use.

As a bonding wire for ball bonding, a copper (Cu) wire coated with palladium (Pd) is known (for example, JP-A-2005-167020), but it has been confirmed that, in a case of using such a Pd-coated Cu wire for wedge bonding, bonding is difficult at the room temperature. Although a sufficient bonding strength can be obtained by heating the wire at the time of bonding, its application is limited because an oxidation is caused by heating, a thermal stress is caused in respective members due to heating and cooling, and further a time is required for heating.

Regarding a bare Cu wire without a coating, a sufficient bonding strength can be obtained at an initial bonding stage of wedge bonding at the room temperature, but a favorable bond reliability cannot be obtained due to proceeding of corrosion at a bonded part with an electrode.

An object of the present invention is to provide a boding wire that exhibits a favorable bondability when being applied to wedge bonding at the room temperature, and also achieves an excellent bond reliability.

Means for Solving Problem

As a result of earnest investigation as to the problem described above, the present inventors have found that the problem described above can be solved by the bonding wire having the configuration described below, and further investigated the problem based on such knowledge to complete the present invention.

That is, the present invention includes the following content.

[1]A bonding wire for semiconductor devices, the bonding wire comprising:

a core material of Cu or Cu alloy (hereinafter referred to as a "Cu core material"); and a coating containing a noble metal formed on a surface of the Cu core material (hereinafter referred to as a "noble metal coating"), wherein a concentration of Cu at a surface of the wire is 30 to 80 at %.

[2] The bonding wire according to [1], wherein the concentration of Cu at the surface is measured by Auger electron spectroscopy (AES) under the following <Condition>:

<Condition> a center of width of a measuring surface is aligned with a center of width of the wire, the width of the measuring surface is 10% or more and 15% or less of a diameter of the wire, and a length of the measuring surface is five times the width of the measuring surface.

[3] The bonding wire according to [1] or [2], wherein the noble metal coating contains Pd.

[4] The bonding wire according to [3], wherein the noble metal coating further contains Au.

[5] The bonding wire according to any one of [1] to [4], wherein a maximum concentration of the noble metal in the noble metal coating is 50 at % or more.

[6.] The bonding wire according to [4] or [5], wherein, in the noble metal coating, a position indicating a maximum concentration of Au is closer to the surface of the wire than a position indicating a maximum concentration of Pd.

[7] The bonding wire according to [5] or [6], wherein a maximum concentration of the noble metal in the noble metal coating is determined from a concentration profile in a depth direction that is obtained by performing measurement by Auger electron spectroscopy (AES) under the following <Condition> while digging down the wire from its surface in the depth direction by Ar sputtering:

<Condition> a center of width of a measuring surface is aligned with a center of width of the wire, the width of the measuring surface is 10' or more and 15% or less of a diameter of the wire, and a length of the measuring surface is five times the width of the measuring surface.

[8] The bonding wire according to any one of [1] to [7], wherein the Cu core material consists of Cu and inevitable impurities.

[9] The bonding wire according to any one of [1] to [8], wherein the noble metal coating consists of the noble metal and inevitable impurities.

[10] The bonding wire according to any one of [1] to [7], wherein the bonding wire contains at least one element selected from the group consisting of Ni, Zn, Rh, In, Ir and Pt (hereinafter referred to as a "first additive element"), and a concentration of the first additive element in total is 0.1 to 1.5% by mass relative to the entire wire.

[11] The bonding wire according to any one of [1] to [7], and [10], wherein the boning wire contains at least one element selected from the group consisting of P, B, Be, Fe, Mg, Ti, Zn, Ag and Si (hereinafter referred to as a "second additive element"), and a concentration of the second additive element in total is 0.1 to 200 ppm by mass relative to the entire wire.

[12] The bonding wire according to [10] or [11], wherein the Cu core material consists of Cu, at least one element selected from the first additive element and the second additive element, and inevitable impurities.

[13] The bonding wire according to any one of [10] to [12], wherein the noble metal coating consists of the noble metal, at least one element selected from the first additive element and the second additive element, and inevitable impurities.

[14] The bonding wire according to any one of [1] to [13], wherein an average crystal grain size in a cross-section of the Cu core material in a direction perpendicular to a wire axis is 1.4 to 3.2 $\mu$m.

[15] The bonding wire according to any one of [1] to [14] used for wedge-wedge bonding.

[16] A method for manufacturing a semiconductor device, the method comprising:

a step of connecting a first electrode on a semiconductor element to a second electrode on a lead frame or circuit board with using the bonding wire according to any one of [1] to [15], wherein a first connection between the first electrode and the bonding wire and a second connection between the second electrode and the bonding wire are both performed by wedge bonding.

[17] The method according to [16], wherein the first connection and the second connection are performed at the room temperature.

[18] A semiconductor device comprising the bonding wire according to any one of [1] to [15].

Effect of the Invention

The present invention can provide a bonding wire that exhibits a favorable bondability when being applied to wedge bonding at the room temperature, and also achieves an excellent bond reliability.

Embodiment for Carrying Out the Invention

Hereinafter, the present invention will be described in detail based on a preferred embodiment thereof.

[Bonding Wire for Semiconductor Devices]

A bonding wire for semiconductor devices of the present invention includes:

a core material of Cu or Cu alloy (hereinafter also referred to as a "Cu core material"), and a coating containing a noble metal (hereinafter also referred to as a "noble metal coating") formed on a surface of the Cu core material, wherein a concentration of Cu at a surface of the wire is 30 to 80 at %.

As described above, the Pd-coated Cu wire is known as a bonding wire for ball bonding, but it has been confirmed that, in a case of using such a Pd-coated Cu wire for wedge bonding, bonding is difficult at the room temperature. In the Pd-coated Cu wire for ball bonding, a high concentration of Pd coating is provided on a surface of the wire to suppress oxidation at the time of ball formation. On the other hand, in bonding using a Cu wire, a sufficient bonding strength is achieved by a diffusion bonding between Cu and an electrode metal. It is estimated that, when the Pd-coated Cu wire for ball bonding is used for wedge bonding at the room temperature (25±10° C.), the diffusion bonding between Cu and the electrode metal is suppressed due to a high concentration of Pd coating that is present on the surface of the wire, so that sufficient bonding cannot be achieved. Although a sufficient bonding strength can be obtained by heating the wire at the time of bonding, its application is limited because an oxidation is caused by heating, a thermal stress is caused in respective members due to heating and cooling, and further a time is required for heating. An Al wire or a bare Cu wire without a coating may be applied, but these wires have the problem that a favorable bond reliability is hardly obtained as described above.

In a process of carrying out earnest investigation to provide a bonding wire that exhibits a favorable bondability when being applied to wedge bonding at the room temperature and also achieves an excellent bond reliability, the present inventors have found that, by increasing the concentration of Cu at a surface of the Cu wire having the noble metal coating, the Cu wire exhibits a favorable bondability even when being applied to wedge bonding at the room temperature. Additionally, the present inventors have also found that the Cu wire having the noble metal coating and the concentration of Cu at the surface thereof falling within a predetermined range can achieve the favorable bond reliability even in a case of manufacturing a semiconductor device by the resin sealing. It is estimated that a region including a certain concentration of noble metal is present on a bonding interface because the noble metal coating is included, and a proceeding of corrosion at a bonded part with an electrode is remarkably suppressed by such a region containing the noble metal. Additionally, even when being applied to the use where a remarkable temperature change is occurred in accordance with an operation cycle of device such as a power semiconductor device, the Cu wire having the noble metal is mainly made of Cu, so that it is possible to remarkably suppress the generation of a crack (a bond crack or a heel crack) at an interface of a connection part or in the vicinity thereof due to a thermal stress, which becomes a problem for the Al wire. Therefore, the present invention greatly contributes to putting a Cu-based wire into practical use in a wedge bonding including a room-temperature bonding, and contributes to achieving an inexpensive and high-performance semiconductor device.

In the bonding wire for semiconductor devices of the present invention (hereinafter also simply referred to as "the wire of the present invention", or "the wire"), a lower limit of the concentration of Cu at the surface is 30 at % or more, preferably 35 at % or more, and more preferably 40 at % or more, 42 at % or more, 44 at % or more, or 45 at % or more, in view of achieving a favorable bondability even when the wire is applied to wedge bonding at the room temperature. The present inventors have confirmed that, when the concentration of Cu at the surface falls within such a range, an excellent effect of suppressing the proceeding of galvanic corrosion can be achieved even in a case of applying the wire to a high-temperature use.

The present inventors have found that, particularly when the concentration of Cu at the surface is 45 at % or more, a remarkably excellent bondability can be achieved in a case of applying the wire to wedge bonding at the room temperature. The concentration of Cu at the surface is more preferably 46 at % or more, 48 at % or more, 50 at % or more, or more than 50 at %.

In view of achieving a favorable bond reliability even in a case of manufacturing the semiconductor device with the resin sealing, and in view of achieving a favorable bond reliability especially in a high-temperature and high-humidity environment, an upper limit of the concentration of Cu at the surface is 80 at % or less, preferably 75 at % or less, and more preferably 70 at, or less, 65 at or less, or 60 at % or less.

In the present invention, the concentration of Cu at the surface can be determined by measuring the wire surface as a measuring surface with using Auger electron spectroscopy (AES). Specifically, the composition analysis is performed on the wire surface by the Auger electron spectroscopy (AES). Herein, when determining the concentration of Cu at the surface, a gas component such as carbon (C), sulfur (S), oxygen (O) or nitrogen (N), a nonmetallic element, and the like are not considered.

When performing the composition analysis on the wire surface by the Auger electron spectroscopy (AES), a position and dimensions of the measuring surface are determined as follows. In the following description, the width of the measuring surface indicates the dimension of the measuring surface in a direction perpendicular to a wire axis (a thickness direction of the wire), and the length of the measuring surface indicates the dimension of the measuring surface in a direction along the wire axis (a length direction of the wire).

First, the wire to be measured is fixed to a sample holder in a linear arrangement. Next, the measuring surface is determined so that a center of width of the measuring surface is aligned with a center of width of the wire in the direction perpendicular to the wire axis, and the width of the measuring surface is 10% or more and 15% or less of a diameter of the wire. The length of the measuring surface is set to be 5 times the width of the measuring surface. By determining the position and dimensions of the measuring surface as described above, it is possible to measure the concentration of Cu at the surface, which is required for achieving a favorable bondability even when being applied to wedge bonding at the room temperature, with high accuracy. It is preferable to perform the measurement for measuring surfaces at a plurality of points (n 3) which are separated from each other by 1 mm or more in the direction of the wire axis, and employ an average value thereof.

The concentration of Cu at the surface described above is based on a result of measurement under the conditions described in [Composition analysis on wire surface by Auger electron spectroscopy (AES)] described later.

—Cu Core Material—

The wire of the present invention includes a core material of Cu or Cu alloy, that is, a Cu core material.

The Cu core material is not limited so long as it is made of Cu or Cu alloy, and there may be used a known Cu core material constituting a conventional Pd-coated Cu wire that is known as a bonding wire for ball bonding.

The Cu core material may contain at least one dopant selected from a first additive element and a second additive element described later, for example. Preferable contents of these dopants are described later.

In a preferred embodiment, the Cu core material consists of Cu and inevitable impurities. In another preferred embodiment, the Cu core material consists of Cu, at least one element selected from the first additive element and the second additive element described later, and inevitable impurities. The term "inevitable impurities" used in relation to the Cu core material encompasses elements constituting the noble metal coating described later.

When being contained in other metal, Cu easily diffuses at a high temperature. When a heat treatment is performed at the time of manufacturing the wire of the present invention which includes the Cu core material and the noble metal coating formed on the surface of the Cu core material, Cu in the Cu core material can diffuse in the noble metal coating to reach the surface of the wire. The wire of the present invention is characterized in that the concentration of Cu at the surface falls within a predetermined range, and Cu at the surface of the wire may be Cu that has reached the surface due to such diffusion. In the wire of the present invention, a state of Cu at the surface is not particularly limited. A part of Cu may be oxidized, or may be dissolved in the noble metal in the noble metal coating as a solid solution.

In view of achieving a particularly favorable bondability in a case of applying the wire of the present invention to wedge bonding at the room temperature (furthermore, in a case of reducing a load and an ultrasonic condition at the time of bonding), an average crystal grain size in a cross-section of the Cu core material (a C cross-section of the Cu core material) in a direction perpendicular to the wire axis is preferably 1.4 μm or more, and more preferably 1.5 μm or more, 1.6 μm or more, 1.8 μm or more, or 2 μm or more. In view of achieving a favorable loop shape stability, an upper limit of the average crystal grain size is preferably 3.2 μm or less, and more preferably 3.1 μm or less, or 3 μm or less. Thus, in a preferred embodiment, the average crystal grain size in the C cross-section of the Cu core material is 1.4 to 3.2 μm. As for the average crystal grain size, a measuring method such as EBSD (Electron Back Scatter Diffraction Patterns) is used to determine the area of each crystal grain and then to calculate the average of diameter of each crystal grain on the supposition that each crystal grain is a circle. The average crystal grain size in the C cross-section of the Cu core material can be measured by the method described in [Measurement of average crystal grain size on C cross-section of Cu core material] described later.

—Noble Metal Coating—

The wire of the present invention includes a coating containing a noble metal formed on the surface of the Cu core material, that is, the noble metal coating.

The noble metal contained in the noble metal coating is not limited so long as it does not inhibit the effect of the present invention. The noble metal coating preferably contains palladium (Pd) or gold (Au) in view of achieving a particularly favorable bond reliability even in a case of manufacturing the semiconductor device by the resin sealing. More preferably, the noble metal contained in the noble metal coating is palladium (Pd).

When defining the total content of noble metals contained in the noble metal coating as 100% by mass, a content of Pd is preferably 50% by mass or more, and more preferably 60% by mass or more, 70% by mass or more, 80% by mass or more, or 90% by mass or more. An upper limit of the content is not limited, and may be 100% by mass. For example, the upper limit of the content may be 99% by mass or less, 98% by mass or less, or 97% by mass or less.

The noble metal coating may further contain at least one dopant selected from the first additive element and the second additive element described later, for example. Preferable contents of these dopants are described later.

In a preferred embodiment, the noble metal coating consists of a noble metal and inevitable impurities. In another preferred embodiment, the noble metal coating consists of a noble metal, at least one element selected from the first additive element and the second additive element described later, and inevitable impurities. The term "inevitable impurities" used in relation to the noble metal coating encompasses elements constituting the Cu core material.

In view of achieving a favorable bond reliability even in a case of manufacturing the semiconductor device by the resin sealing, especially in view of achieving a favorable bond reliability under a high-temperature and high-humidity environment, a maximum concentration of the noble metal in the noble metal coating is preferably 50 at % or more. In view of achieving a particularly favorable bond reliability under the high-temperature and high-humidity environment, the maximum concentration is more preferably 60 at % or more, 70 at % or more, 75 at % or more, or 80 at % or more. An upper limit of the maximum concentration is not limited, and may be 100 at %. For example, the upper limit of the maximum concentration may be 99.5 at % or less, 99 at % or less, or 98 at % or less. Particularly, when the thickness of the noble metal coating (a calculation method therefor will be described later) is 20 nm or more while satisfying a preferred condition of the maximum concentration, it is preferable because the wire of the present invention can achieve a particularly excellent bond reliability even under the high-temperature and high-humidity environment. The thickness of the noble metal coating is more preferably 25 nm or more, and further preferably 30 nm or more, 35 nm or more, 40 nm or more, 45 nm or more, or 50 nm or more. Although an upper limit of the thickness of the noble metal coating is not limited, it is preferably 0.5 μm or less, and more preferably 0.4 μm or less, 0.3 μm or less, 0.2 μm or less, 0.15 μm or less, or 0.1 μm or less.

In the present invention, the maximum concentration of the noble metal in the noble metal coating can be determined by performing the composition analysis by the Auger electron spectroscopy (AES) while digging down the wire from its surface in a depth direction by Ar sputtering. Specifically, a concentration profile in the depth direction is obtained by repeating 1) sputtering treatment by Ar and 2) surface composition analysis after the sputtering treatment, and the maximum concentration of the noble metal in the noble metal coating can be determined from the concentration profile.

2) The surface composition analysis after the sputtering treatment can be performed under the same condition as that for composition analysis performed by the Auger electron spectroscopy (AES) for determining the concentration of Cu at the surface. Specifically, when performing the composition analysis by the Auger electron spectroscopy (AES) on the surface after the sputtering treatment, the position and the dimensions of the measuring surface are determined as follows.

The measuring surface is determined so that a center of width of the measuring surface is aligned with a center of width of the wire in the direction perpendicular to the wire axis, and the width of the measuring surface is 10% or more and 15% or less of a diameter of the wire. The length of the measuring surface is set to be 5 times the width of the measuring surface. By determining the position and dimensions of the measuring surface as described above, it is possible to measure the maximum concentration of the noble metal in the noble metal coating, which is required for achieving a favorable bond reliability even in a case of manufacturing the semiconductor device by the resin sealing, with high accuracy. It is preferable to perform the measurement for measuring surfaces at a plurality of points ($n \geq 3$) which are separated from each other by 1 mm or more in the direction of the wire axis, and employ an average value thereof.

There will be described a tendency of the concentration profile in the depth direction obtained for the wire of the present invention according to an embodiment. Up to a certain depth position from the surface of the wire, the concentration of Cu tends to be decreased, and the concentration of the noble metal tends to be increased. Further proceeding in the depth direction, the concentration of the noble metal tends to be decreased and the concentration of Cu tends to be increased from a certain depth position (d). In such a concentration profile, focusing on the increase or decrease in the concentration of the noble metal, the maximum concentration of the noble metal can be determined from a position at which the concentration of the noble metal becomes the maximum (in the embodiment described above, the depth position d). In a case where the noble metal coating contains a plurality of noble metals, there may be focused on the increase or decrease in a total concentration of the noble metals to determine the "maximum concentration of the noble metal". For example, the increase or decrease in a concentration of Pd may be focused on in a case where the noble metal coating contains only Pd, and the increase or decrease in the total concentration of Pd and Au may be focused on in a case where the noble metal coating contains Pd and Au in combination.

The preferred range of the maximum concentration of the noble metal in the noble metal coating described above is based on a result of measurement under the conditions described in [Obtaining of concentration profile in depth direction by Auger electron spectroscopy (AES)] described later.

In the wire of the present invention, the noble metal coating may contain gold (Au) in addition to Pd. If the noble metal coating further contains Au in addition to Pd, it is possible to achieve the bonding wire that exhibits a particularly favorable bondability when being applied to wedge bonding at the room temperature, and also achieves a particularly excellent bond reliability.

In a case where the noble metal coating contains Au, a content of Au is preferably 0.5% by mass or more, and more preferably 1% by mass or more, 1.5% by mass or more, or 2% by mass or more, when defining the total content of noble metals contained in the noble metal coating as 100% by mass. In view of preventing an excessive increase in cost, an upper limit of the content may be 10% by mass or less, 7% by mass or less, 5% by mass or less, or 3% by mass or less, for example.

In a case where the noble metal coating further contains Au in addition to Pd, it is preferable that, in the noble metal coating, a position indicating the maximum concentration of Au is closer to the surface of the wire than a position indicating the maximum concentration of Pd in view of further obtaining the effect of the present invention. In this case, in the concentration profile in the depth direction obtained as described above, there may be focused on the increase or decrease in the concentration of Au and the increase or decrease in the concentration of Pd, respectively.

In the wire of the present invention, a boundary between the Cu core material and the noble metal coating is determined based on the total concentration of the noble metals. The position at which the total concentration of the noble metals is 20 at % is defined as the boundary, a region where the total concentration of the noble metals is 20 at % or more is determined to be the noble metal coating, and a region where the total concentration of the noble metals is lower than 20 at % is determined to be the Cu core material. A phase (layer) closer to the surface of the wire than the noble metal coating as determined above is determined to be the noble metal coating even if the total concentration of the noble metals thereof is lower than 20 at %.

In the concentration profile in the depth direction obtained by the Auger electron spectroscopy (AES), the thickness of the noble metal coating can be determined, by checking the concentration profile from the wire axis toward the wire surface, as a distance from a depth position at which the total concentration of the noble metals reaches 20 at % for the first time to the wire surface position. The thickness of the noble metal coating described above is based on the concentration profile in the depth direction obtained by the Auger electron spectroscopy (AES), specifically, based on the concentration profile in the depth direction in which the unit of the depth is in terms of $SiO_2$.

The wire of the present invention may further contain at least one element ("first additive element") selected from the group consisting of Ni, Zn, Rh, In, Ir and Pt. The concentration of the first additive element in total is preferably 0.1% by mass relative to the entire wire. Accordingly, it is possible to achieve the bonding wire that can further suppress the proceeding of galvanic corrosion even when being applied to a high-temperature use, and can achieve a particularly excellent bond reliability. The concentration of the first additive element in total relative to the entire wire is more preferably 0.3% by mass or more, and further preferably 0.5% by mass or more. In view of suppressing a hardening of the wire and readily achieving a favorable bondability in a case of applying the wire to wedge bonding at the room temperature, an upper limit of the total concentration of the first additive element is preferably 1.5% by mass or less, and more preferably 1.4% by mass or less, 1.3% by mass or less, or 1.2% by mass or less. Thus, in a preferred embodiment, the wire of the present invention contains the first additive element, and the concentration of the first additive element in total is 0.1 to 1.5% by mass respective to the entire wire. Alternatively, regarding the first additive element, the concentration of Ni relative to the entire wire may be lower than 0.1% by mass, for example, may be 0.09% by mass or less, or 0.08% by mass or less.

The wire of the present invention may further contain at least one element ("second additive element") selected from the group consisting of P, B, Be, Fe, Mg, Ti, Zn, Ag and Si. The concentration of the second additive element in total is preferably 0.1 ppm by mass or more relative to the entire wire. Accordingly, it is possible to achieve the wire that is further excellent in loop shape stability. The concentration of the second additive element in total relative to the entire wire is more preferably 1 ppm by mass or more, further preferably 2 ppm by mass or more, 3 ppm by mass or more, 5 ppm by mass or more, 8 ppm by mass or more, 10 ppm by mass or more, 20 ppm by mass or more, 30 ppm by mass or more, or 40 ppm by mass or more, and further more preferably 50 ppm by mass or more, or 55 ppm by mass or more. In view of suppressing a hardening of the wire and readily achieving a favorable bondability in a case of applying the wire to wedge bonding at the room temperature, an upper limit of the total concentration of the second additive element is preferably 200 ppm by mass or less, and more preferably 190 ppm by mass or less, 180 ppm by mass or less, 170 ppm by mass or less, 160 ppm by mass or less, or 150 ppm by mass or less.

The contents of the first additive element and the second additive element in the wire can be measured by the method described in [Measurement of element content] described later.

A diameter of the wire of the present invention is not limited and may be appropriately determined depending on specific purposes. Preferably, the diameter of the wire may be 15 μm or more, 18 μm or more, or 20 μm or more, for example. An upper limit of the diameter is not limited and may be 200 μm or less, 150 μm or less, or 100 μm or less, for example.

<Manufacturing Method for Wire>

There will be described an example of a method for manufacturing the bonding wire for semiconductor devices according to the present invention.

First, raw material copper having high purity (4 N to 6 N; 99.99 to 99.9999% by mass or more) is processed to have a large diameter (diameter of about 3 to 6 mm) by continuous casting, and an ingot is obtained.

In a case of adding a dopant such as the first additive element and the second additive element described above, examples of an addition method therefor may include a method of causing the dopant to be contained in the Cu core material, a method of causing the dopant to be contained in the noble metal coating, a method of depositing the dopant on the surface of the Cu core material, and a method of depositing the dopant on the surface of the noble metal coating. These methods may be combined with each other. The effect of the present invention can be achieved by employing any addition method. In the method of causing the dopant to be contained in the Cu core material, a copper alloy containing a required concentration of dopant may be used as a raw material to manufacture the Cu core material. In a case of obtaining such a copper alloy by adding the dopant to Cu as the raw material, a dopant component having high purity may be directly added to Cu, or alternatively, a mother alloy containing a dopant component at a concentration of about 1% may be used. In the method of causing the dopant to be contained in the noble metal coating, the dopant may be contained in a noble metal plating bath at the time of forming the noble metal coating (in a case of wet plating), or in a target material (in a case of dry plating). In the method of depositing the dopant on the surface of the Cu core material and the method of depositing the dopant on the surface of the noble metal coating, at least one type of deposition treatment selected from (1) application of aqueous solution⇒drying⇒heat treatment, (2) a plating method (wet), and (3) a vapor deposition method (dry) may be performed while the surface of the Cu core material or the surface of the noble metal coating being as a deposition surface.

The ingot having a large diameter is subjected to forging, rolling, and wire-drawing to manufacture a wire with a diameter of about 0.9 to 1.2 mm (hereinafter also referred to as an "intermediate wire").

As a method for forming the noble metal coating on the surface of the Cu core material, an electroplating, an electroless plating, a vapor deposition, and the like can be used. Among them, the electroplating is preferable industrially because it can stably control film thickness. For example, in a case of forming the noble metal coating containing Pd and Au in combination, after forming a Pd coating on a surface of the intermediate wire, an Au coating may be formed on a surface of the Pd coating. The Pd coating and the Au coating may be deposited at a stage of the ingot having large diameter, or the Pd coating and the Au coating may be formed on the surface of the Cu core material after further thinning the intermediate wire by performing the wire-drawing (for example, after carrying out the wire-drawing to a final diameter of the Cu core material).

The wire-drawing process can be performed by using a continuous wire-drawing machine in which a plurality of diamond-coated dies can be set. If necessary, heat treatment may be performed during the wire-drawing process. By performing a heat treatment to diffuse Pd and Au each other, the noble metal coating containing an alloy of Au and Pd may be formed. As a method therefor, a method that promotes alloying by continuously sweeping the wire at a constant speed in an electric furnace at a constant furnace temperature is preferable in that the composition and thickness of the alloy can surely be controlled.

After the wire-drawing process, surface refining heat treatment is performed. In view of readily achieving the bonding wire having the concentration of Cu at the surface thereof falling within a predetermined range, the surface refining heat treatment is preferably performed at a high temperature for a long time. Although depending on the thickness of the noble metal coating, a desired concentration of Cu at the surface, and the like, the temperature of the surface refining heat treatment is preferably determined within a range from 0.6 Tm to 0.8 Tm when defining that a melting point of copper is Tm (K). The melting point Tm of copper is 1358 K (=1085° C.), so that the temperature of the surface refining heat treatment preferably falls within a range from 540° C. to 820° C. A time for the surface refining heat treatment is preferably 5 seconds or more, and more preferably 7 seconds or more, or 10 seconds or more. An upper limit of the time for the heat treatment may be 20 seconds or less, for example.

As an atmospheric gas for the surface refining heat treatment, preferred is an inert gas containing hydrogen, for example, a helium gas containing hydrogen, a nitrogen gas containing hydrogen, and an argon gas containing hydrogen. A hydrogen concentration in the inert gas containing hydrogen may fall within a range from 1 to 20%, for example. In a preferred embodiment, the atmospheric gas for the surface refining heat treatment is a forming gas (5% $H_2$—$N_2$). Alternatively, an inert gas such as a nitrogen gas or an argon gas may be used as the atmospheric gas under strict control for the temperature and the time for the heat treatment.

The wire of the present invention can be used for connecting a first electrode on a semiconductor element to a second electrode on a lead frame or a circuit board when manufacturing the semiconductor device. Wedge bonding may be used for both of the first connection (1st bonding) with the first electrode on the semiconductor element and the second connection (2nd bonding) with the second electrode on the lead frame or the circuit board. With the wire of the present invention having the noble metal coating and the concentration of Cu at the surface thereof falling within the predetermined range, a favorable bondability can be achieved even in a case of performing wedge bonding at the room temperature. Thus, the wire of the present invention can be preferably used for wedge bonding (specifically, for wedge-wedge bonding), and can be also preferably used for room-temperature wedge bonding (specifically, for room-temperature wedge-wedge bonding).

[Method for Manufacturing Semiconductor Device]

The semiconductor device can be manufactured by connecting the electrode on the semiconductor element to the electrode on the lead frame or the circuit board by using the bonding wire for semiconductor devices of the present invention.

In an embodiment, the method for manufacturing the semiconductor device of the present invention (hereinafter also simply referred to as a "method of the present invention") includes a step of connecting the first electrode on the semiconductor element to the second electrode on the lead frame or circuit board with using the wire of the present invention, and is characterized in that the first connection between the first electrode and the wire of the present invention and the second connection between the second electrode and the wire of the present invention are both performed by wedge bonding.

In the wedge bonding, the wire part is compression-bonded onto the electrode by applying ultrasonic waves, and pressure to the wire part without forming the ball. With the wire of the present invention having the noble metal coating and the concentration of Cu at the surface thereof falling within the predetermined range, a favorable bondability can be achieved even in a case of performing wedge bonding at the room temperature. Accordingly, in a preferred embodiment, the first connection and the second connection are performed at the room temperature in the method of the present invention.

With the wire of the present invention having the noble metal coating and the concentration of Cu at the surface thereof falling within the predetermined range, a favorable bond reliability can be achieved even in a case of manufacturing the semiconductor device by the resin sealing. Thus, in a preferred embodiment, the method of the present invention further includes a step of performing the resin sealing after the wedge bonding. As resin used for the resin sealing, there may be used a known thermosetting resin composition (for example, an epoxy resin composition) that may be used for the resin sealing in manufacturing the semiconductor device. By using the wire of the present invention, a favorable bond reliability can be advantageously achieved irrespective of specifications of the thermosetting resin composition.

[Semiconductor Device]

The semiconductor device can be manufactured by connecting the electrode on the semiconductor element to the electrode on the lead frame or the circuit board by using the bonding wire for semiconductor devices of the present invention.

In an embodiment, the semiconductor device of the present invention includes a circuit board, a semiconductor element, and a bonding wire for electrically connecting the circuit board and the semiconductor element with each other, and is characterized in that the bonding wire is the bonding wire of the present invention.

In the semiconductor device of the present invention, the circuit board and the semiconductor element are not particularly limited, and a known circuit board and semiconductor element that may be used for constituting the semiconductor device may be used. Alternatively, a lead frame may be used in place of the circuit board. For example, like the semiconductor device disclosed in JP 2002-246542 A, the semiconductor device may include a lead frame and a semiconductor element mounted on the lead frame.

Examples of the semiconductor device may include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like.

EXAMPLES

There will be specifically described the present invention with Examples. However, the present invention is not limited to the Examples described below.

(Sample)

First, the method of preparing a sample will be described. For Cu as a raw material of the Cu core material, Cu having a purity of 99.99% by mass or more (4N) with the balance composed of inevitable impurities was used. In a case of adding the first additive element or the second additive element, an additive element having a purity of 99% by mass or more with the balance composed of inevitable impurities was used, or alternatively a mother alloy of Cu with a high concentration of these additive elements was used.

The Cu alloy as the core material was manufactured by charging raw materials into a carbon crucible, heating and melting the raw materials at 1,090 to 1,300° C. in vacuum or in an inert atmosphere such as an $N_2$ or Ar gas using a high-frequency furnace. The obtained alloy was processed to have a large diameter by continuous casting, and subsequently subjected to wire-drawing processing to be thinned to have a final wire diameter. The resultant core material of copper or copper alloy of $\varphi^3$ to 6 mm was drawn to manufacture the core material of $\varphi 0.9$ to 1.2 mm, and then, wire-drawing processing and the like were continuously performed thereon using dies to further reduce the diameter of the wire. A commercially available lubricant was used in a case of performing wire-drawing processing, and a wire-drawing speed was 20 to 150 m/min. After performing an acid washing with hydrochloric acid to remove an oxide film on the wire surface, a Pd coating was formed to cover the entire surface of the Cu alloy of the core material. Furthermore, in some of wires (Example Nos. 1 to 6, 9 to 14, 17 to 28, and Comparative Example Nos. 1 to 4), an Au coating was formed on the Pd coating. An electroplating method was used for forming the Pd coating and the Au coating. A commercially available plating solution was used as a Pd plating solution and an Au plating solution.

Thereafter, the wire was further subjected to wire-drawing processing and the like to be processed to have a final wire diameter of $\varphi 35$ μm. During the wire-drawing processing, heat treatment was performed 0 to 2 times at 300 to 700° C. for 2 to 15 seconds as needed. After the wire was processed to have the final wire diameter, the surface refining heat treatment was performed. The heat treatment temperature for the surface refining heat treatment was 500 to 750° C., a wire feeding speed was 30 to 100 m/min, and a heat treatment time was 2 to 15 seconds. A method of heat treatment for the intermediate heat treatment and the surface refining heat treatment was performed while continuously sweeping the wire and was carried out while flowing an Ar gas.

(Test and Evaluation Methods)

There will be described test and evaluation methods.

[Composition Analysis on Wire Surface by Auger Electron Spectroscopy (AES)]

The concentration of Cu at the surface of the wire was determined by performing a measurement by the Auger electron spectroscopy (AES) where the measuring surface was a surface of the wire as follows.

First, the bonding wire to be measured was fixed to the sample holder in a linear arrangement. Next, the measuring surface was determined so that the center of width of the measuring surface was aligned with the center of width of the wire in the direction perpendicular to the longitudinal axis of the wire, and the width of the measuring surface was 10% or more and 15% or less of the diameter of the wire. The length of the measuring surface was set to be 5 times the width of the measuring surface. With using an AES device (PHI-700 manufactured by ULVAC-PHI, INC.), the composition analysis was performed on the surface of the wire under a condition of acceleration voltage of 10 kV to obtain a surface Cu concentration (at %).

The composition analysis by the AES was performed on the measuring surfaces at three points which were separated from each other by 1 mm or more in the longitudinal direction of the wire, and an average value thereof was employed. When determining the concentration of Cu at the surface, a gas component such as carbon (C), sulfur (S), oxygen (O), or nitrogen (N), a nonmetallic element, and the like were not considered.

[Obtaining of Concentration Profile in Depth Direction by Auger Electron Spectroscopy (AES)]

The concentration profile in the depth direction of the wire was obtained by performing a composition analysis by the AES while digging down the wire from its surface in the depth direction by Ar sputtering after the composition analysis on the wire surface by the AES.

Specifically, the concentration profile in the depth direction was obtained by repeating 1) sputtering treatment by Ar and 2) surface composition analysis after the sputtering treatment, after the composition analysis on the wire surface by the AES. The sputtering treatment in 1) was performed at an acceleration voltage of 1 kV with $Ar^+$ ion. In the surface composition analysis in 2), the dimensions of the measuring surface and the conditions for the composition analysis by the AES were the same as those described in [Composition analysis on wire surface by Auger electron spectroscopy (AES)] described above.

The concentration profile in the depth direction was obtained for the measuring surfaces at three points which were separated from each other by 1 mm or more in the longitudinal direction of the wire.

—Maximum Concentration of Noble Metal in Noble Metal Coating—

In the concentration profile in the depth direction as obtained above, focusing on the increase or decrease in the concentration of the noble metal, the maximum concentration of the noble metal was determined from a position at which the concentration of the noble metal becomes maximum. An average value of numerical values obtained for the measuring surfaces at three points was employed as the maximum concentration of the noble metal.

Regarding the wires of Examples and Comparative Examples in which the noble metal coating contains Pd and Au, it was confirmed that the position indicating the maximum concentration of Au is closer to the surface of the wire than the position indicating the maximum concentration of Pd.

—Thickness of Noble Metal Coating—

In the concentration profile in the depth direction as obtained above, the concentration profile was checked from the wire axis toward the wire surface, and the thickness of the noble metal coating was determined as a distance from the depth position at which the total concentration of the noble metals reaches 20 at % for the first time to the wire surface position. An average value of numerical values obtained for the measuring surfaces at three points was employed as the thickness of the noble metal coating.

The thickness of the noble metal coating was determined based on the concentration profile in the depth direction in which the unit of the depth was in terms of $SiO_2$.

15 16

[Measurement of Element Content]

The contents of the first additive element and the second additive element in the wire were analyzed as concentrations of elements contained in the entire wire using an ICP emission spectroscopic analysis device and an ICP mass spectroscopic device. As an analysis device, ICP-OES ("PS3520UVDDII" manufactured by Hitachi High-Tech Corporation) or ICP-MS ("Agilent 7700× ICP-MS" manufactured by Agilent Technologies, Inc.) was used.

[Measurement of Average Crystal Grain Size in C Cross-Section of Cu Core Material]

The average crystal grain size in the C cross-section of the Cu core material was measured by using an Electron Back-scattered Diffraction (EBSD) method (measurement device: EBSD analysis system "AZtec HKL" manufactured by Oxford Instruments). Specifically, areas of respective crystal grains were obtained for the entire C cross-section of the Cu core material, the areas of the respective crystal grains were converted into areas of circles to calculate an average of diameters thereof, and the average was employed as the average crystal grain size. The area of each crystal grain was obtained while a position at which an orientation difference between adjacent measurement points was 15 degrees or more was defined as a grain boundary.

[Room-Temperature Wedge Bondability]

Wedge bonding was performed, at the room temperature (25° C.), on an electrode that was disposed by depositing an Al-0.5 mass % Cu alloy having a thickness of 3.0 μm on a silicon substrate. Bonding strengths were measured by performing a shear test for bonded parts at 20 points that were randomly selected, and average value thereof was employed as a bonding strength of a wedge bonded part. Evaluation was then performed in accordance with the following criteria.

Evaluation criteria:
⊚: 100 gf or more
o: 75 gf or more and smaller than 100 gf
Δ: 50 gf or more and smaller than 75 gf
x: smaller than 50 gf

[Bond Reliability]

The bond reliability was evaluated by both of a Highly Accelerated Temperature and Humidity Stress Test (HAST) and a High Temperature Storage Life Test (HTSL).

—HAST—

A sample was prepared by performing wedge bonding, at the room temperature, on an electrode that was disposed by depositing an Al-0.5 mass % Cu alloy having a thickness of 3.0 μm on a silicon substrate. The resultant sample was sealed by a commercially available thermosetting epoxy resin to manufacture a sample for bond reliability evaluation. The manufactured sample for bond reliability evaluation was exposed to a high-temperature and high-humidity environment with a temperature of 130° C. and a relative humidity of 85% using an unsaturated type pressure cooker tester and was biased with 7 V. The shear test on the wedge bonded part was performed every 48 hours, and a time until a value of shear force became half of the initial shear force was determined to be the bonding life of the wedge bonded part. An average value of measurement values of 50 wedge bonded parts randomly selected was used for the value of the shear force. The shear test was performed after removing the resin by acid treatment, and exposing the wedge bonded part. Evaluation was then performed in accordance with the following criteria.

Evaluation criteria:
⊚: bonding life of 384 hours or more
o: bonding life of 240 hours or more and less than 384 hours
x: bonding life of less than 240 hours

—HTSL—

The sample for bond reliability evaluation manufactured by the same procedure as that described above was exposed to an environment with a temperature of 175° C. using a high-temperature thermostatic device. The pull test on the wedge bonded part was performed every 500 hours, and a time until a value of pull force became half of the initial pull force was determined to be the bonding life of the wedge bonded part. An average value of measurement values of 50 wedge bonded parts randomly selected was used for the value of the pull force. The pull test after the High Temperature Storage Life Test was performed after removing the resin by acid treatment, and exposing the wedge bonded part. Evaluation was then performed in accordance with the following criteria.

Evaluation criteria:
⊚: bonding life of 2000 hours or more
o: bonding life of 1000 hours or more and less than 2000 hours
x: bonding life of less than 1000 hours

[Loop Shape Stability]

In the evaluation of the loop shape stability, 100 trapezoid loops were connected so as to achieve a wire length of 2 mm and a loop height of 300 μm, and the loop shape stability (reproducibility of a loop profile) was evaluated based on a standard deviation of the maximum loop height. An optical microscope was used for measuring the height, and evaluation was performed in accordance with the following criteria.

Evaluation criteria:
⊚: 3σ was smaller than 20 μm
o: 3σ was 20 μm or more and smaller than 25 μm
x: 3σ was 25 μm or more Evaluation results of Examples and Comparative Examples are shown in Table 1.

TABLE 1

| | No. | Surface Cu concentration at % | First additive element (% by mass) | | | | | | Second additive element (ppm by mass) | | | | | | | | |
|---|---|---|---|---|---|---|---|---|---|---|---|---|---|---|---|---|---|
| | | | Ni | Zn | Rh | In | Ir | Pt | P | B | Be | Fe | Mg | Ti | Zn | Ag | Si |
| Example | 1 | 53 | | | | | | | 1 | | | | | | | | |
| | 2 | 51 | 0.5 | | | | | | | 30 | | | | | | | |
| | 3 | 57 | | 0.3 | | | | | | | 50 | | | | | | |
| | 4 | 55 | | | 0.5 | | | | | | | 100 | | | | | |
| | 5 | 53 | | | | 1 | | | | | | | 3 | | | | |
| | 6 | 60 | | | | | 1.4 | | | | | | | 75 | | | |
| | 7 | 52 | | | | | | 0.2 | | | | | | | 62 | | |

TABLE 1-continued

| No. | at % | Ni | Zn | Rh | In | Ir | Pt | P | B | Be | Fe | Mg | Ti | Zn | Ag | Si |
|---|---|---|---|---|---|---|---|---|---|---|---|---|---|---|---|---|
| 8 | 55 | 0.8 | | | | | | | | | | | | | 150 | |
| 9 | 32 | | | | | | | | | | | | | | 25 | |
| 10 | 47 | | | | | | | 0.8 | 55 | | | | | | | |
| 11 | 38 | | | 1.1 | | | | | 0.5 | | | | | | | |
| 12 | 37 | | | | 0.6 | | | | | 12 | | | | | | |
| 13 | 41 | | | | | 0.2 | | | | | 21 | | | | | |
| 14 | 45 | | | | | | 0.8 | | | | | 75 | | | | |
| 15 | 34 | | | | | | | 0.9 | | | | | 28 | | | |
| 16 | 35 | | | | | | | | | | | | | | | 15 |
| 17 | 78 | 0.6 | | | | | | 150 | | | | | | | | |
| 18 | 72 | | 0.8 | | | | | | 21 | | | | | | | |
| 19 | 79 | | | 1.4 | | | | | | 50 | | | | | | |
| 20 | 69 | | | | | 1.1 | | | | | 33 | | | | | |
| 21 | 68 | | | | | | 0.6 | | | | | 46 | | | | |
| 22 | 66 | | | | | | | 0.3 | | | | | 24 | | | |
| 23 | 72 | 1.2 | | | | | | | | | | | | | 3 | |
| 24 | 75 | | | | | | | | | | | | | | | 5 |

| | | Noble metal coating | | Cu core material | Room-temperature wedge bond-ability | Bond reliability | | |
|---|---|---|---|---|---|---|---|---|
| | No. | Maximum concentration of noble metal at % | Thickness nm | Crystal grain size | | HAST 130° C./ 85% RH/7V | HTSL 175° C. | Loop shape stability |
| Example | 1 | 78 | 65 | 2 | ◎ | ○ | ○ | ○ |
| | 2 | 73 | 67 | 2.2 | ◎ | ○ | ◎ | ○ |
| | 3 | 67 | 73 | 2.5 | ◎ | ○ | ○ | ◎ |
| | 4 | 79 | 66 | 2 | ◎ | ○ | ◎ | ◎ |
| | 5 | 66 | 78 | 2.6 | ◎ | ○ | ◎ | ○ |
| | 6 | 65 | 79 | 2.6 | ◎ | ○ | ◎ | ◎ |
| | 7 | 73 | 69 | 2.1 | ◎ | ○ | ○ | ◎ |
| | 8 | 68 | 74 | 2.5 | ◎ | ○ | ◎ | ◎ |
| | 9 | 90 | 51 | 1.5 | ○ | ◎ | ○ | ○ |
| | 10 | 80 | 69 | 2.6 | ◎ | ◎ | ◎ | ◎ |
| | 11 | 81 | 65 | 2.2 | ○ | ◎ | ◎ | ○ |
| | 12 | 83 | 64 | 2.3 | ○ | ◎ | ◎ | ○ |
| | 13 | 82 | 60 | 2.4 | ○ | ◎ | ○ | ○ |
| | 14 | 81 | 58 | 2.5 | ◎ | ◎ | ◎ | ◎ |
| | 15 | 91 | 52 | 1.5 | ○ | ◎ | ◎ | ○ |
| | 16 | 90 | 53 | 1.6 | ○ | ◎ | ○ | ○ |
| | 17 | 51 | 92 | 3.1 | ◎ | ○ | ◎ | ◎ |
| | 18 | 65 | 85 | 2.8 | ◎ | ○ | ◎ | ◎ |
| | 19 | 61 | 81 | 2.7 | ◎ | ○ | ◎ | ◎ |
| | 20 | 54 | 79 | 2.6 | ◎ | ○ | ◎ | ○ |
| | 21 | 57 | 80 | 2.8 | ◎ | ○ | ◎ | ○ |
| | 22 | 59 | 81 | 2.9 | ◎ | ○ | ○ | ○ |
| | 23 | 60 | 82 | 3 | ◎ | ○ | ◎ | ○ |
| | 24 | 53 | 90 | 3.1 | ◎ | ○ | ○ | ○ |

TABLE 2

| | No. | Surface Cu concentration at % | First additive element (% by mass) | | | | | | Second additive element (ppm by mass) | | | | | | | | |
|---|---|---|---|---|---|---|---|---|---|---|---|---|---|---|---|---|---|
| | | | Ni | Zn | Rh | In | Ir | Pt | P | B | Be | Fe | Mg | Ti | Zn | Ag | Si |
| Example | 25 | 52 | | | | | | | | | | | | | | | |
| | 26 | 51 | | | | | | | | | | | | | | | |
| | 27 | 39 | | | | | | | | | | | | | | | |
| | 28 | 45 | | | | | | | | | | | | | | | |
| | 29 | 71 | | | | | | | | | | | | | | | |
| | 30 | 78 | | | | | | | | | | | | | | | |
| | 31 | 60 | | | 0.2 | | 0.2 | | | | | | | | | | |
| | 32 | 79 | | 0.7 | | 0.5 | | | | | | | | | | | |
| | 33 | 75 | | | | | | | 150 | | | 20 | | | | | |
| | 34 | 19 | | | | | | | 210 | | | | | | | | |
| | 35 | 77 | | 1.2 | | | | | | 150 | | | 50 | | | | |
| | 36 | 60 | | | | | | 0.08 | | | | | | | | | |
| | 37 | 63 | | | 1.6 | | | | | 30 | | | | | | | |

TABLE 2-continued

| Comparative | 1 | 12 |
| Example | 2 | 28 |
| | 3 | 82 |
| | 4 | 85 |

| | | | Noble metal coating | | Cu core | Room-temperature | Bond reliability | | |
| | | | Maximum concentration of noble metal | Thickness | material Crystal grain | ature wedge bond- | HAST 130° C./ 85% | HTSL | Loop shape |
| | | No. | at % | nm | size | ability | RH/7V | 175° C. | stability |
|---|---|---|---|---|---|---|---|---|---|
| Example | | 25 | 79 | 66 | 2.1 | ◎ | ○ | ○ | ○ |
| | | 26 | 73 | 68 | 2.1 | ◎ | ○ | ○ | ○ |
| | | 27 | 80 | 69 | 2.6 | ○ | ◎ | ○ | ○ |
| | | 28 | 81 | 69 | 2.5 | ◎ | ◎ | ○ | ○ |
| | | 29 | 66 | 80 | 2.9 | ◎ | ○ | ○ | ○ |
| | | 30 | 52 | 82 | 3 | ◎ | ○ | ○ | ○ |
| | | 31 | 67 | 70 | 2.6 | ◎ | ○ | ◎ | ○ |
| | | 32 | 88 | 53 | 2.2 | ◎ | ○ | ◎ | ○ |
| | | 33 | 53 | 90 | 2.4 | ○ | ○ | ○ | ◎ |
| | | 34 | 84 | 52 | 2.1 | Δ | ◎ | ○ | ◎ |
| | | 35 | 52 | 90 | 2.7 | Δ | ○ | ◎ | ◎ |
| | | 36 | 66 | 70 | 2.4 | ◎ | ○ | ○ | ○ |
| | | 37 | 65 | 77 | 2.3 | Δ | ○ | ◎ | ◎ |
| Comparative | | 1 | 96 | 43 | 1.4 | X | ◎ | X | ○ |
| Example | | 2 | 95 | 44 | 1.3 | X | ◎ | X | ○ |
| | | 3 | 40 | 101 | 3.3 | ◎ | X | ○ | X |
| | | 4 | 38 | 99 | 3.2 | ◎ | X | ○ | X |

Regarding all of Example Nos. 1 to 37, the noble metal coating was formed on the surface of the Cu core material and the concentration of Cu at the surface fell within the range of the present invention, and it was confirmed that a favorable bondability was achieved in wedge bonding at the room temperature, and excellent bond reliability was also achieved.

Further, it was confirmed that Example Nos. 2 to 8, 10 to 15, 17 to 23, 31, 32, 35 and 37 containing 0.1% by mass or more in total of the first additive element (especially, Example Nos. 2, 4 to 6, 8, 10 to 12, 14, 15, 17 to 21, 23, 31, 32, 35 and 37 in which the content of the first additive element was 0.5% by mass or more) was able to further suppress the proceeding of galvanic corrosion in a high-temperature environment, and achieved a particularly excellent bond reliability (HTSL).

It was confirmed that Example Nos. 1 to 24, 33 to 35 and 37 containing 0.1 ppm by mass or more in total of the second additive element (especially, Example Nos. 3, 4, 6 to 8, 10, 14, 17, 19, 33 to 35 and 37 in which the content of the second additive element was 50 ppm by mass or more) achieved a particularly excellent loop shape stability.

On the other hand, it was confirmed that, in Comparative Example Nos. 1 to 4, the noble metal coating was formed on the surface of the Cu core material, but the concentration of Cu at the surface was out of the range of the present invention, and it was confirmed that a bonding failure was caused or a bond reliability became unfavorable in a case of applying the wire to wedge bonding at the room temperature.

The invention claimed is:

1. A bonding wire for semiconductor devices, the bonding wire comprising:
   a core material of Cu or Cu alloy (hereinafter referred to as a "Cu core material"); and
   a coating containing a noble metal formed on a surface of the Cu core material (hereinafter referred to as a "noble metal coating"), wherein a concentration of Cu at a surface of the wire is more than 50 at % and 80 at % or less.

2. The bonding wire according to claim 1, wherein the concentration of Cu at the surface is measured by Auger electron spectroscopy (AES) under the following <Condition>:
   <Condition> a center of width of a measuring surface is aligned with a center of width of the wire, the width of the measuring surface is 10% or more and 15% or less of a diameter of the wire, and a length of the measuring surface is five times the width of the measuring surface.

3. The bonding wire according to claim 1, wherein the noble metal coating contains Pd.

4. The bonding wire according to claim 3, wherein the noble metal coating further contains Au.

5. The bonding wire according to claim 4, wherein, in the noble metal coating, a position indicating a maximum concentration of Au is closer to the surface of the wire than a position indicating a maximum concentration of Pd.

6. The bonding wire according to claim 1, wherein a maximum concentration of the noble metal in the noble metal coating is 50 at % or more.

7. The bonding wire according to claim 6, wherein a maximum concentration of the noble metal in the noble metal coating is determined from a concentration profile in a depth direction that is obtained by performing measurement by Auger electron spectroscopy (AES) under the following <Condition> while digging down the wire from its surface in the depth direction by Ar sputtering:
   <Condition> a center of width of a measuring surface is aligned with a center of width of the wire, the width of the measuring surface is 10% or more and 15% or less of a diameter of the wire, and a length of the measuring surface is five times the width of the measuring surface.

8. The bonding wire according to claim 1, wherein an average crystal grain size in a cross-section of the Cu core material in a direction perpendicular to a wire axis is 1.4 to 3.2 μm.

9. The bonding wire according to claim 1 used for wedge-wedge bonding.

10. A semiconductor device comprising the bonding wire according to claim 1.

11. The bonding wire according to claim 1, wherein the bonding wire satisfies at least one conditions of the following (i) and (ii):

(i) the bonding wire contains at least one element selected from the group consisting of Ni, Zn, Rh, In, Ir and Pt (hereinafter referred to as a "first additive element"), and a concentration of the first additive element in total is 0.1 to 1.5% by mass relative to the entire wire;

(ii) the bonding wire contains at least one element selected from the group consisting of P, B, Be, Fe, Mg, Ti, Zn, Ag and Si (hereinafter referred to as a "second additive element"), and a concentration of the second additive element in total is 0.1 to 200 ppm by mass relative to the entire wire.

12. A method for manufacturing a semiconductor device, the method comprising:

a step of connecting a first electrode on a semiconductor element to a second electrode on a lead frame or circuit board with using the bonding wire according to claim 1, wherein a first connection between the first electrode and the bonding wire and a second connection between the second electrode and the bonding wire are both performed by wedge bonding.

13. The method according to claim 12, wherein the first connection and the second connection are performed at the room temperature.

\* \* \* \* \*